(12) United States Patent
Cho et al.

(10) Patent No.: US 11,521,918 B2
(45) Date of Patent: Dec. 6, 2022

(54) SEMICONDUCTOR DEVICE HAVING COMPONENT MOUNTED ON CONNECTION BAR AND LEAD ON TOP SIDE OF LEAD FRAME AND METHOD OF MANUFACTURING SEMICONDUCTOR DEVICE THEREOF

(71) Applicant: Amkor Technology Singapore Holding Pte. Ltd., Singapore (SG)

(72) Inventors: Hyung Jun Cho, Incheon (KR); Kyoung Yeon Lee, Incheon (KR); Tae Yong Lee, Gyeonggi-do (KR); Jae Min Bae, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 698 days.

(21) Appl. No.: 16/504,917

(22) Filed: Jul. 8, 2019

(65) Prior Publication Data
US 2021/0013136 A1    Jan. 14, 2021

(51) Int. Cl.
| | |
|---|---|
| *H01L 23/495* | (2006.01) |
| *H01L 21/48* | (2006.01) |
| *H01L 21/56* | (2006.01) |
| *H01L 23/31* | (2006.01) |
| *H01L 23/498* | (2006.01) |

(52) U.S. Cl.
CPC .... *H01L 23/49568* (2013.01); *H01L 21/4839* (2013.01); *H01L 21/565* (2013.01); *H01L 23/3107* (2013.01); *H01L 23/49517* (2013.01); *H01L 23/49548* (2013.01); *H01L 23/49575* (2013.01); *H01L 23/49861* (2013.01)

(58) Field of Classification Search
CPC ............ H01L 23/49568; H01L 21/565; H01L 21/4839; H01L 23/49861; H01L 23/49575; H01L 23/49517; H01L 23/3107; H01L 23/49548; H01L 23/4951; H01L 23/49537; H01L 23/49555; H01L 23/49562; H01L 23/49589
See application file for complete search history.

(56) References Cited

U.S. PATENT DOCUMENTS

| | | | |
|---|---|---|---|
| 6,919,631 B1 * | 7/2005 | Hoffman | H01L 23/552 257/707 |
| 2007/0284715 A1 * | 12/2007 | Li | H01L 23/3135 257/686 |
| 2010/0019363 A1 * | 1/2010 | Galera | H01L 23/49589 257/676 |
| 2012/0139122 A1 * | 6/2012 | Honjo | H01L 25/16 257/773 |
| 2019/0259689 A1 * | 8/2019 | Lui | H01L 23/49816 |

* cited by examiner

*Primary Examiner* — Michael Jung
(74) *Attorney, Agent, or Firm* — Spectrum IP Law Group LLC

(57) ABSTRACT

In one example, a semiconductor device comprises a substrate and an electronic device on a top side of the substrate, a lead frame on the top side of the substrate over the electronic device, wherein the lead frame comprises a connection bar and a lead, a component mounted to the connection bar and the lead on a top side of the lead frame, and an encapsulant on the top side of the substrate, wherein the encapsulant contacts a side of the electronic device and a side of the component. Other examples and related methods are also disclosed herein.

18 Claims, 9 Drawing Sheets

US 11,521,918 B2

SEMICONDUCTOR DEVICE HAVING COMPONENT MOUNTED ON CONNECTION BAR AND LEAD ON TOP SIDE OF LEAD FRAME AND METHOD OF MANUFACTURING SEMICONDUCTOR DEVICE THEREOF

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
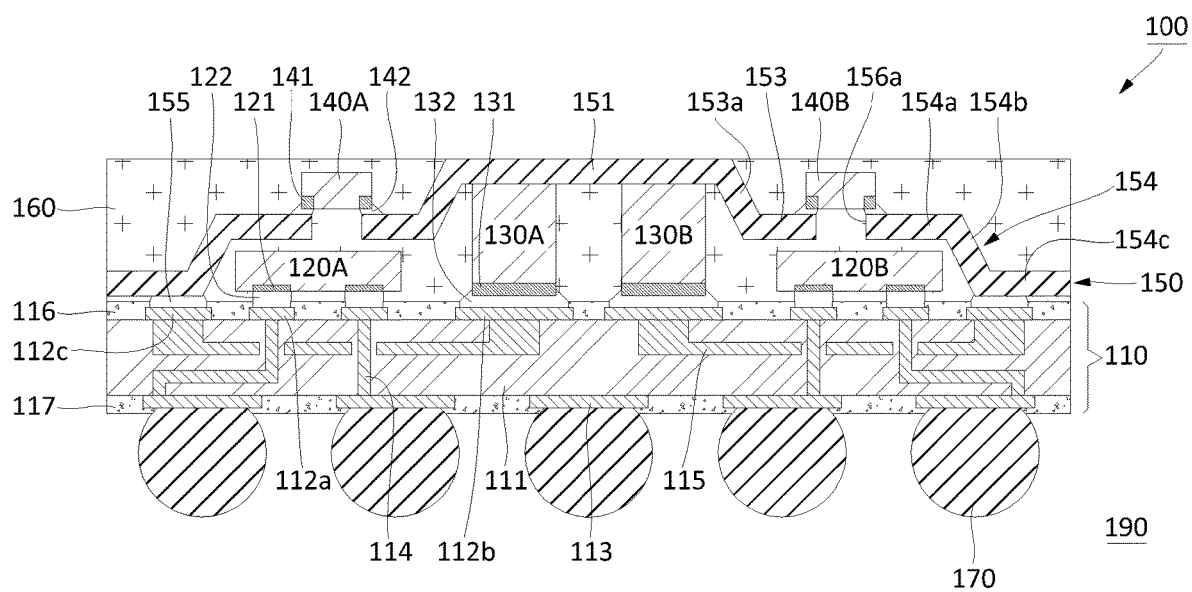
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and/or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a substrate and an electronic device on a top side of the substrate, a lead frame on the top side of the substrate over the electronic device, wherein the lead frame comprises a connection bar and a lead, a component mounted to the connection bar and the lead on a top side of the lead frame, and an encapsulant on the top side of the substrate, wherein the encapsulant contacts a side of the electronic device and a side of the component.

In another example, a method to manufacture a semiconductor device comprises providing a substrate having a top side, providing an electronic device on the top side of the substrate, mounting a component on a top side of a lead frame, wherein the component is mounted between a connection bar and a lead of the lead frame, connecting the lead frame to the top side of the substrate, and providing an encapsulant on the top side of the substrate contacting a side of the electronic device and a side of the component.

In yet another example, a semiconductor structure comprises a substrate having a top side and a conductive path, a lead frame comprising a heatsink, a connection bar, a downset between the heatsink and the connection bar, and a lead electrically coupled with the conductive path, wherein the connection bar is lower than the heatsink, a first component on the top side of the substrate and coupled to the heatsink, a second component on a top side of the lead frame between the connection bar and the lead, and an encapsulant on the top side of the substrate contacting a side of the second component.

Other examples are included in the present disclosure. Such examples may be found in the figures, in the claims, and/or in the description of the present disclosure.

FIG. 1 shows a cross-sectional view of an example semiconductor device 100. In the example shown in FIG. 1, semiconductor device 100 can include a substrate 110, electronic devices 120A and 120B, components 130A, 130B, 140A and 140B, a lead frame 150, an encapsulant 160 and external interconnects 170.

Substrate 110 can include dielectric structure 111 comprising one or more dielectric layers, wiring patterns 112a, 112b, 112c, and 113, conductive paths 114 and 115, and passivation layers 116 and 117. In some examples, passivation layers 117 and 117 can be considered part of the one or more dielectric layers of dielectric structure 111.

Electronic devices 120A and 120B can include terminals 121 and interconnects 122. Components 130A, 130B, 140A and 140B can also include terminals 131, 141 and interconnects 132, 142. Electronic devices 120A and 120B cab be on the top side of substrate 110.

Lead frame 150 can include a paddle 151, a connection bar 153 having a down set 153a, a mounting region 154a, a downset 154b, a lead 154 having a connection region 154c, and interconnects 155. In some examples, lead 154 can be electrically coupled with one or more of conductive paths 114 and 115 of substrate 110 via one or more of interconnects 155. In addition, components 140A and 140B can be mounted on lead frame 150. In some examples, one or more of components 140A and 140B can be mounted to connection bar 153 and lead 154 on a top side of lead frame 150. Further, a gap 156a can be provided between connection bar 153 and lead 154. Lead frame 150 can be on the top side of substrate 110 over one or more of electronic device 120A and 120B. In some examples, lead frame 150 can comprise connection bar 153 and lead 154 over one or more of electronic device 120A and 120B.

Encapsulant 160 can encapsulate electronic devices 120A and 120B, components 130A, 130B, 140A, and 140B and lead frame 150, which are positioned on substrate 110. In some examples, one or more of components 130A and 130B can be coupled to paddle 151 or heatsink. External interconnects 170 can be connected to substrate 110. Encapsulant 160 can be on the top side of substrate 110, and encapsulant 160 can contact a side of one or more of electronic device 120A and 120B, or a side of one or more of components 130A, 130B, 140A, and 140B.

Substrate 110, lead frame 150, encapsulant 160 and external interconnects 170 can be referred to as semiconductor package 190 for electronic devices 120A and 120B, components 130A, 130B, 140A, and 140B. Semiconductor package 190 can protect electronic devices 120A and 120B and components 130A, 130B, 140A, and 140B from being exposed to external factors and/or circumstances. In addition, semiconductor package 190 can provide electrical couplings between an external device and external interconnects 170.

Figure 2:
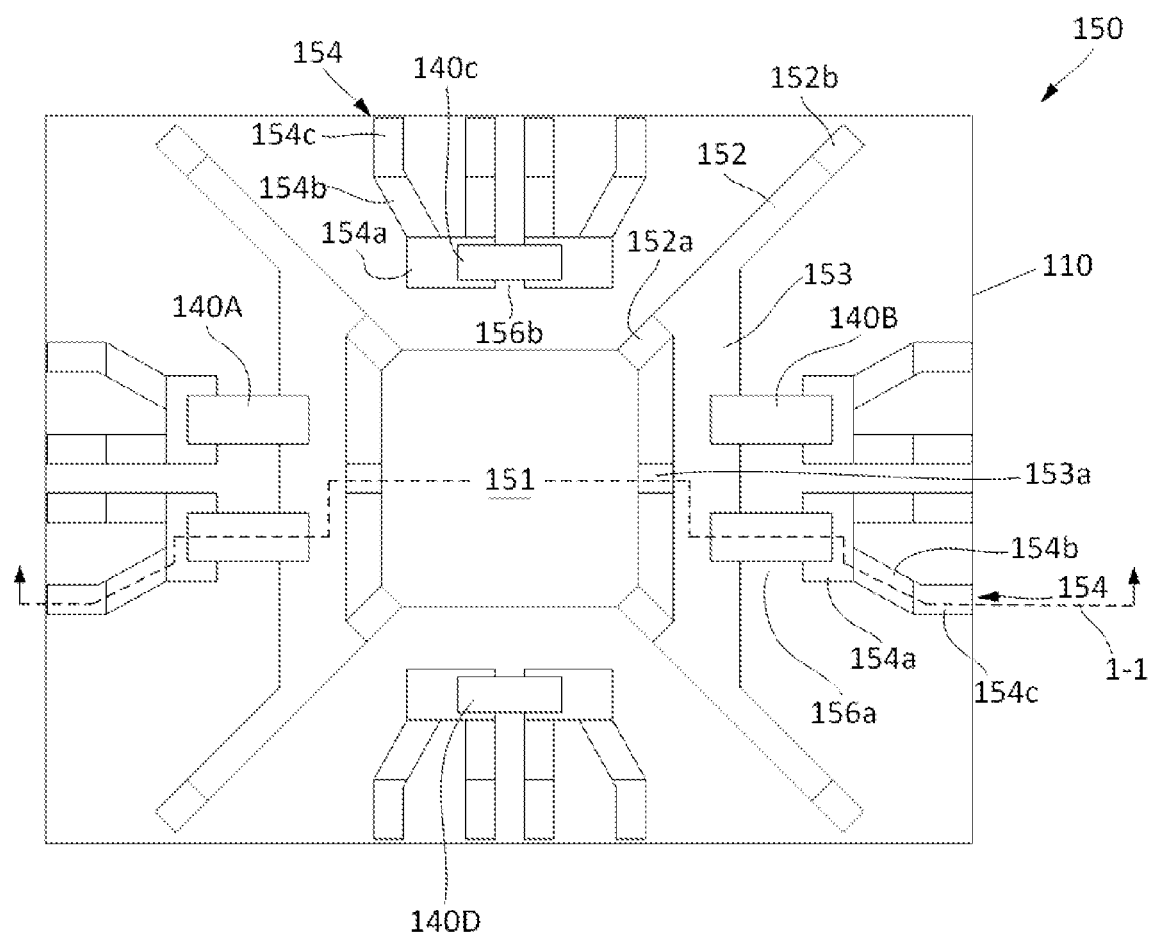
FIG. 2 shows a plan view of a lead frame on which an example component is mounted.

FIG. 2 shows a plan view of a lead frame 150 on which example components 140A, 140B, 140C, and 140D are mounted. In the example shown in FIG. 2, lead frame 150 can include a paddle 151, a tie bar 152 having downsets 152a and 152b, a connection bar 153 connected to paddle 151 and tie bar 152, and a lead 154 having a downset 154b. In some examples, paddle 151 can be a heatsink to transfer heat from one or more of components 130A and 130B to the ambient environment. As can be seen in FIG. 1, connection bar 153 can be at a lower level in encapsulant 160 than the level of paddle 151 or heatsink. In some examples, components 140A and 140B can be electrically connected between connection bar 153 and lead 154 and can be at a level lower than a top side of paddle 151 or heatsink. In some examples, components 140C and 140D can be electrically connected between neighboring leads 154. In some examples, a gap 156a can be provided between connection bar 153 and lead 154 connected by components 140A and 140B. In addition, in some examples, gap 156b can be provided between neighboring leads 154 connected by components 140C and 140D.

In some examples, paddle 151 can be substantially planar, and tie bar 152 can extend diagonally and outwardly from an edge of paddle 151. Tie bar 152 can include downset 152a formed at an end adjacent with paddle 151, and downset 152b formed at the other end adjacent with a frame of lead frame 150. In some examples, connection bar 153 can connect two tie bars 152 to each other. In some examples, connection bar 153 can be connected to tie bar 152 between two downsets 152a and 152b of tie bar 152. In some examples, connection bar 153 can be directly connected to paddle 151 through downset 153a. In some examples, connection bar 153 can be connected to only tie bar 152 or only paddle 151. Top surfaces of components 130A and 130b can be in contact with paddle 151 to allow heat generated from components 130A and 130B to be rapidly dispersed.

In some examples, lead 154 can be arranged at a region facing one of four sides of paddle 151. In some examples, when paddle 151 has four sides, different leads 154 can also be positioned at one or more regions corresponding to such four sides. In some examples, the lengthwise direction of lead 154 can be substantially perpendicular its corresponding one of the four sides of paddle 151. In some examples, lead 154 can include a mounting region 154a facing connection bar 153, a downset 154b extending from mounting region 154a, and a connection region 154c extending from downset 154b to be connected to substrate 110. Interconnects 155 can be formed at a bottom end of connection region 154c to be connected to substrate 110. In some examples, lead 154 can be electrically coupled to one or more of conductive paths 114 and 115 via one or more of interconnects 154 for example at connection region 154c. Components 140A, 140B, 140C, and 140D can be attached to lead 154 and can be electrically connected to substrate 110.

In some examples, lead frame 150 can be made of a copper alloy (including at least one of Ni, Si, P and Ti in Cu), an iron-nickel alloy, or a Cu/SUS/Cu clad metal. In some examples, lead frame 150 can be formed using etching or stamping. In some examples, lead frame 150 can include a plating layer (not shown) thereon, the plating layer made of, for example, tin, nickel, palladium, gold, or silver. Here, in order to reduce the cost, the plating layer can be selectively formed only on portions where components 140A, 140B, 140C, and 140D are to be mounted. In addition, in some examples, an anticorrosive layer can be formed on the portions where components 140A, 140B, 140C, and 140D are to be mounted. In some examples, lead frame 150 can have a thickness in the range from approximately 0.1 mm to approximately 0.3 mm. In some examples, plating layer can have a thickness in the range from approximately 1 μm to approximately 100 μm.

Figure 3A:
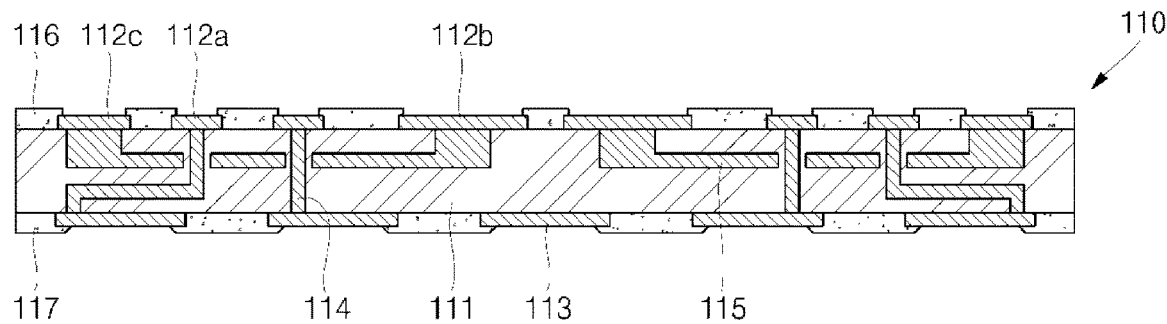
FIGS. 3A to 3G show cross-sectional views of an example method for manufacturing an example semiconductor device.

FIG. 3A to FIG. 3G show cross-sectional views of an example method for manufacturing an example semiconductor device 100. FIG. 3A shows a cross-sectional view of substrate 110 at an initial stage of manufacture.

In the example shown in FIG. 3A, substrate 110 can be provided and can include dielectric structure 111, upper wiring patterns 112a, 112b, and 112c, lower wiring patterns 113, conductive paths 114 and 115, an upper passivation layer 116, and a lower passivation layer 117. In some examples, at least one of lower wiring patterns 113, conductive paths 114 and 115, upper passivation layer 116, and/or lower passivation layer 117 can be omitted.

In some examples, substrate 110 can be referred to as a printed circuit board (PCB), a printed wiring board, a single-sided PCB, a double-sided PCB, a multi-layered PCB, a through hole PCB, a non-through hole PCB, a rigid PCB, a flexible PCB, a paper phenol PCB, a glass epoxy PCB, a polyimide PCB, a polyester PCB, a molded plastic PCB, a ceramic PCB, an etched foil process PCB, an additive process PCB, a pre-molded lead frame, and so on. There can be examples where substrate 110 can be a buildup substrate, having one or more conductive and dielectric layers that are built upon each other layer on a carrier and without a core (e.g., fiberglass) layer.

In some examples, substrate 110 can be a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

In some examples, substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

In some examples, dielectric structure 111 can be substantially planar, with top and bottom surfaces. In some examples, dielectric structure 111 can comprise or be referred to one or more dielectric layers. In some examples, dielectric structure 111 can include an epoxy resin, a phenol resin, glass epoxy, polyimide, polyester, an epoxy molding compound, ceramic, or the like. In some examples, dielectric structure 111 can have a thickness in the range from approximately 0.1 mm to approximately 0.3 mm. Dielectric structure 111 can allow substrate 110 to be maintained in a substantially planar state. In addition, dielectric structure 111 can allow wiring patterns 112a, 112b, 112c, and 113a positioned on or inside dielectric structure 111, conductive paths 114 and 115, etc. to be insulated from one another.

Upper wiring patterns 112a, 112b, and 112c can be formed on a top surface of dielectric structure 111, and lower wiring patterns 113 can be formed on a bottom surface of dielectric structure 111. In some examples, upper wiring patterns 112a, 112b, and 112c and lower wiring patterns 113 can comprise or be referred to as patterns, traces, pads, under bump metallization (UBM), or conductors. In some examples, upper wiring patterns 112a, 112b, and 112c and/or lower wiring patterns 113 can include copper, iron, nickel, gold, silver, palladium, or tin. In some examples, upper wiring patterns 112a, 112b, and 112c, and/or lower wiring patterns 113 can have a thickness, a width, and a space in the range from approximately 0.1 mm to approximately 0.3 mm. Upper wiring patterns 112a, 112b, and 112c and lower wiring patterns 113 can electrically connect electronic devices 120A and 120B to components 130A and 130B, electronic devices 120A and 120B to an external device (not shown), or components 130A and 130B to the external device.

Conductive paths 114 and 115 can electrically connect upper wiring patterns 112a, 112b, and 112c to lower wiring pattern 113 while passing through dielectric structure 111. In some examples, conductive paths 114 and 115 can comprise or be referred to as traces, conductive vias, or conductive through holes. Conductive paths 114 and 115 can be formed from portions of multiple conductive layers alternatingly stacked with multiple dielectric layers of dielectric structure 111. In some examples, conductive paths 114 and 115 can include copper, iron, nickel, gold, silver, palladium, or tin. In some examples, conductive paths 114 and 115 can have a thickness in the range from approximately 0.1 mm to approximately 0.3 mm. In some examples, conductive paths 114 and 115 can electrically connect any one of upper wiring patterns 112a, 112b, and 112c to another one of upper wiring patterns 112a, 112b and 112c. In addition, in some examples, conductive paths 114 and 115 can electrically connect any one of lower wiring patterns 113 to another one of to another one of lower wiring patterns 113.

Upper passivation layer 116 can roughly cover the top surface of dielectric structure 111 and/or a portion of upper wiring patterns 112a, 112b, and 112c, and lower passivation layer 117 can roughly cover the bottom surface of dielectric structure 111 and/or a portion of lower wiring patterns 113. In some examples, upper passivation layer 116 and/or lower passivation layer 117 can be referred to as dielectric layers, solder masks, or solder resists. In some examples, regions of upper wiring patterns 112a, 112b, and 112c, on which electronic devices 120A and 120B and/or components 130A and 130B are to be mounted, may not be covered by upper passivation layer 116. Further, regions of lower wiring patterns 113, on which external interconnects 170 are to be connected, may not be covered by lower passivation layer 117. In some examples, upper passivation layer 116 and/or lower passivation layer 117 can include polymer, polyimide (PI), benzocyclobutene (BCB), polybenzoxazole (PBO), bismaleimide triazine (BT), a molding material, a phenolic resin, an epoxy, silicone, or an acrylate polymer. In some examples, upper passivation layer 116 and/or lower passivation layer 117 can have a thickness in the range from approximately 0.1 mm to approximately 0.3 mm. Upper passivation layer 116 can protect upper wiring patterns 112a, 112b, and 112c during the manufacture of semiconductor device, and lower passivation layer 117 can protect lower wiring patterns 113 during the manufacture of semiconductor device. In some examples, upper passivation layer 116 and/or lower passivation layer 116 can be considered part of dielectric structure 111.

Substrate 110 can support electronic devices 120A and 120B, components 130A, 130B, 140A, and 140B, and/or lead frame 150, and can allow electronic devices 120A and 120B, components 130A, 130B, 140A, and 140B, and/or lead frame 150 to exchange electrical signals with an external device. Substrate 110 is just provided as an example substrate for a better understanding of this disclosure. In some examples, substrate 110 can have a single-layered structure, instead of a multi-layered structure. Additionally, substrates having a variety of structures that have not illustrated or described can be applied to this disclosure.

Figure 3B:
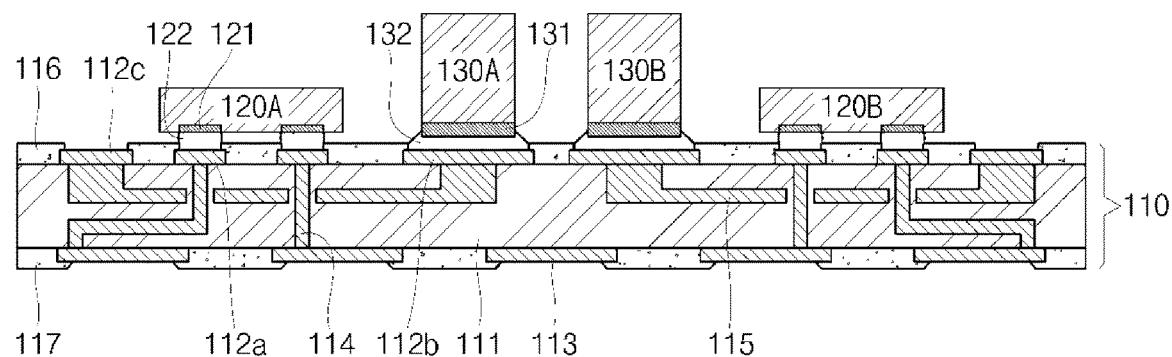

FIG. 3B shows a state in which electronic devices 120A and 120B and/or components 130A and 130B are mounted on substrate 110 at a later stage of manufacture. In the example shown in FIG. 3B, electronic devices 120A and 120B can be provided on the top side of substrate 110 and can be connected to upper wiring pattern 112a of substrate 110. In some examples, electronic devices 120A and 120B can be a semiconductor die, a semiconductor chip, or a package comprising one or more electronic devices.

In some examples, electronic devices 120A and 120B can include an active region and a non-active region. In addition, the active region can include terminals 121. In some examples, terminals 121 can comprise or be referred to as die pads, bond pads, conductive posts, or conductive pillars. Terminals 121 can include, for example, an electrically conductive material, such as, a metallic material, aluminum, copper, an aluminum alloy or a copper alloy.

In some examples, interconnects 122 can be interposed between terminals 121 and/or upper wiring pattern 112a to electrically connect terminals 121 and upper wiring pattern 112a to each other. In some examples, interconnects 122 can comprise or be referred to as bumps, solder balls, solder tips, etc. In some examples, electronic devices 120A and 120B having terminals 121 and interconnects 122 can be mounted on upper wiring pattern 112a of substrate 110, and terminals 121 of electronic devices 120A and 120B can then be electrically connected to upper wiring pattern 112a of substrate 110 through interconnects 122 using a reflow process, a thermal compression process, and/or a laser assist bonding process. Here, electronic devices 120A and 120B can have a thickness in the range from approximately 100 µm to approximately 1,000 µm. In some examples, electronic devices 120A and 120B can be a logic die, a micro control unit, a memory, a digital signal processor, a network processor, a power management unit, an audio processor, an RF circuit, a wireless baseband system on chip processor, an application specific integrated circuit, or an equivalent thereof.

In some examples, electronic devices 120A and 120B can instead be connected to upper wiring pattern 112a of substrate 110 through a conductive wire, such as a gold wire, a copper wire, or an aluminum wire. In the same or other examples, non-active regions of electronic devices 120A and 120B are adhered to substrate 110 using an adhesive, and terminals 121 formed in the non-active regions of electronic devices 120A and 120B can be bonded to upper wiring pattern 112a of substrate 110 using conductive wires.

In addition, in the example shown in FIG. 3B, components 130A and 130B can be connected to upper wiring pattern 112b of substrate 110. In some examples, components 130A and 130B can be referred to as passive elements, such as resistors, capacitors, or inductors. In some examples, components 130A and 130B can also include terminals 131.

In some examples, interconnects 132 can be interposed between terminals 131 and/or upper wiring pattern 112b to then be electrically connected to each other. In some examples, after components 130A and 130B having terminals 131 and interconnects 132 are mounted on upper wiring pattern 112b of substrate 110, terminals 131 of components 130A and 130B can be electrically connected to upper wiring pattern 112b of substrate 110 through interconnects 132 using a reflow process, a thermal compression process, and/or a laser assist bonding process. Here, components 130A and 130B can have a thickness in the range from approximately 100 µm to approximately 10,000 µm. In addition, components 130A and 130B can have thicknesses greater than or smaller than those of electronic devices 120A and 120B.

Figure 3C:
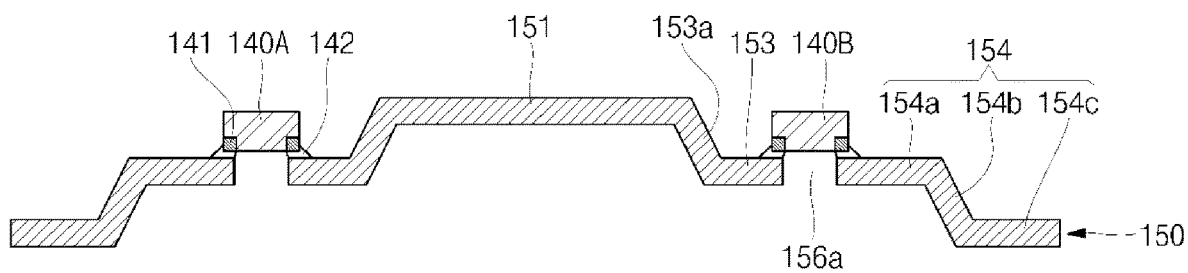

FIG. 3C shows lead frame 150 on which components 140A and 140B are mounted. In some examples, components 140A and 140B can include terminals 141. In some examples, components 140A and 140B can be mounted on a tope side of lead frame 150 and can be connected between connection bar 153 and lead 154 of lead frame 150 through terminals 141 and interconnects 142. In some examples, components 140C and 140D can be electrically connected between leads 154 of lead frame 150 through terminals 141 and interconnects 142 (see FIG. 2).

In some examples, interconnects 142, such as solder paste, can be first formed on connection bar 153 and lead 154, and/or leads 154 using dispensing, stencil printing, etc. Thereafter, components 140A and 140B having terminals 141 can be positioned on solder paste 142 and then be electrically and/or mechanically connected onto lead frame 150 using a reflow process, a thermal compression process, and/or a laser assist bonding process. In some examples, components 140A and 140B can have thicknesses equal to or smaller than heights of downsets 153a. In some examples, components 140A and 140B can have a thickness in the range from approximately 100 µm to approximately 10,000 µm.

Figure 3D:
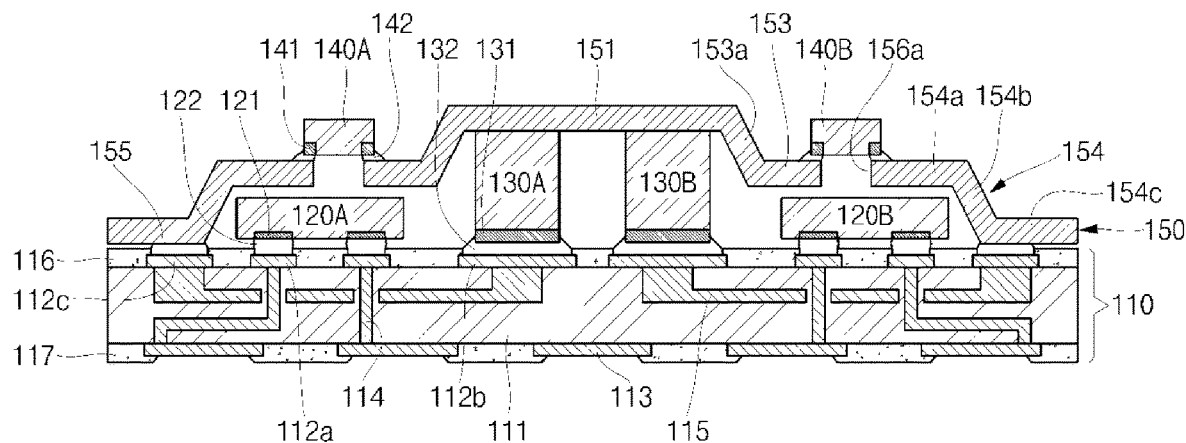

FIG. 3D shows a state in which lead frame 150 is connected to a top side of substrate 110 at a later stage of manufacture. In the example shown in FIG. 3D, connection region 154c of lead frame 150 can be electrically, mechanically, and/or thermally connected to upper wiring pattern 112c provided on substrate 110 through interconnects 155.

In some examples, in a state in which interconnects 155, such as solder paste, are formed on upper wiring pattern 112c of substrate 110 and connection regions 154c of lead frame 150 are positioned thereon, lead frame 150 can be electrically, mechanically, and/or thermally connected to substrate 110 using a reflow process, a thermal compression process, and/or a laser assist bonding process.

In some examples, top surfaces of components 130A and 130B mounted on substrate 110 can be coupled with the bottom surface of paddle 151 of lead frame 150. Such coupling can be achieved directly, or with a coupling material such as thermal-interface-material (TIM) or adhesive between paddle 151 and components 130A and 130B. Therefore, heat generated from components 130A and 130B can be rapidly dispersed through lead frame 150.

In some examples, top surfaces of electronic devices 120A and 120B mounted on substrate 110 can be coupled with bottom surfaces of connection bar 153 and/or lead 154 of lead frame 150. Such coupling can be achieved directly, or with a coupling material such as thermal-interface-material (TIM) or adhesive between connection bar 153 and/or lead 154, and electronic devices 120A and 120B. Therefore, heat generated from electronic devices 120A and 120B can also be rapidly dispersed through lead frame 150.

Further, since lead frame 150 substantially surrounds electronic devices 120A and 120B and/or components 130A and 130B, it is possible to shield electronic devices 120A and 120B and/or components 130A and 130B from electromagnetic interference (EMI). Moreover, since connection regions 154c of lead frame 150 are also electrically, mechanically, and/or thermally connected to substrate 110 through interconnects 155, heat from substrate 110 and can be rapidly dispersed through lead frame 150. Here, components 140A, 140B, 140C, and 140D positioned on lead frame 150 and substrate 110 can exchange electrical signals through interconnects 155.

Figure 3E:
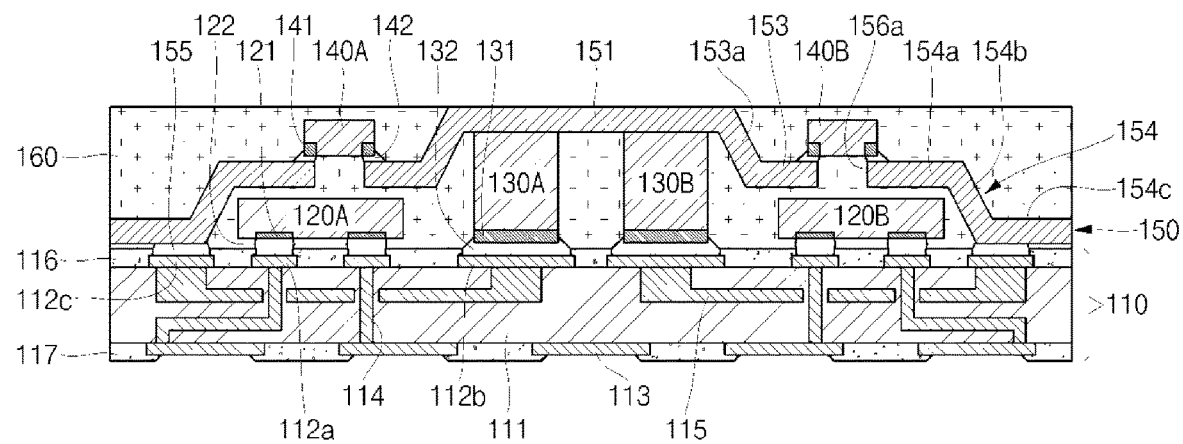

FIG. 3E shows a state resulting after encapsulation is performed using encapsulant 160 at a later stage of manufacture. In the example shown in FIG. 3E, encapsulant 160 can be provided on the top side of substrate 110 and can encapsulate electronic devices 120A and 120B, components 130A, 130B, 140A and 140B, and lead frame 150 mounted on the top side of substrate 110. In some examples, encapsulant 160 may not encapsulate top surface of paddle 151 of lead frame 150. Therefore, the top surface of encapsulant 160 can be coplanar with top surface of paddle 151. In some examples, coplanar can mean that the top surface of paddle 151 or lead frame 150 can generally lie in the same plane as the top surface of encapsulant 160 within some tolerance. In some examples, the top surface of paddle 151 or lead frame 150 can have a flatness of 0.005 mm per 2.54 mm of traverse distance when measuring from the center of paddle 151 or lead frame 150 to any one of the corners of paddle 151 or lead frame 150 on average. In some examples, the top surface of paddle 151 or lead frame can have a flatness not to exceed a total of 0.02 mm in deviation from a planar top surface of paddle 151 or lead frame 150. In this way, the top surface of paddle 151 can be exposed to the outside through encapsulant 160, thereby further enhancing heat dispersion performance of lead frame 150. In some examples, the top surface of paddle 151 or lead frame 150 can protrude slightly above the top surface of encapsulant 160, or the top surface of paddle 151 or lead frame 160 can be recessed slightly with respect to the top surface of encapsulant 160. It should be noted that these are merely examples describing the relationship between the top surface of paddle 151 or lead frame 150 and the top surface of encapsulant 160, and the scope of the disclosure is not limited in these respects.

In some examples, encapsulant 160 can comprise or be referred to as an epoxy molding compound, an epoxy molding resin, or a sealant. In addition, in some examples, encapsulant 160 can comprise or be referred to as a molding part, a sealing part, an encapsulation part, a protection part, a package, or a body part. In some examples, encapsulant 160 can include, but is not limited to, an organic resin, an inorganic filler, a curing agent, a catalyst, a colorant, a flame retardant, and so on.

Molding based on encapsulant 160 can be formed by any of a variety of processes. In some examples, molding 160 can be formed by, but is not limited to, compression molding, transfer molding, liquid-phase encapsulant molding, vacuum lamination, paste printing, or film assist molding. Encapsulant 160 can have a thickness in the range from approximately 200 µm to approximately 10,000 µm. Encapsulant 160 can encapsulate lead frame 150 on which electronic devices 120A and 120B, components 130A and 130B, and components 140A and 140B are mounted, to protect electronic devices 120A and 120B, components 130A and 130B, and components 140A and 140B in a packaged state from external factors or circumstances.

Figure 3F:
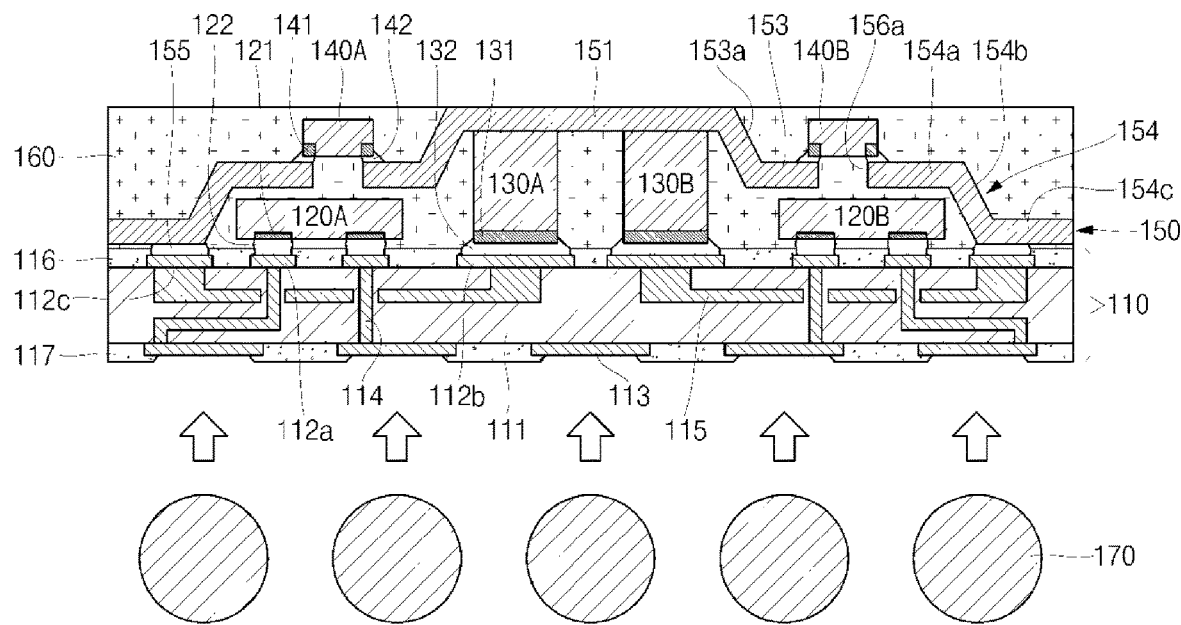

FIG. 3F shows a connecting process of external interconnects 170 at a later stage of manufacture. In the example shown in FIG. 3F, external interconnects 170 can be connected to lower wiring patterns 113 of substrate 110 exposed to the outside through lower passivation layer 117. In some examples, external interconnects 170 can comprise or be referred to as solder balls, solder bumps, conductive balls, conductive bumps, copper pillars, copper posts, conductive pillars, or conductive posts. In some examples, volatile flux can be dotted on the exposed lower wiring patterns 113, and external interconnects 170 can be dropped on the flux. Thereafter, the flux can be entirely volatized to then be removed using a reflow process, and external interconnects 170 can be molted to then be mechanically and/or electrically connected to lower wiring patterns 113. Next, external interconnects 170 can be hardened using a cooling process and then completely mechanically and/or electrically connected to lower wiring patterns 113. In some examples, external interconnects 170 can include tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, Sn—Ag—Cu, and equivalents thereof. External interconnects 170 can allow semiconductor device 100 and an external device to be connected to each other. External interconnects 170 can have a thickness in the range from approximately 60 µm to approximately 400 µm and a width in the range from approximately 50 µm to approximately 500 µm. External interconnects 170 can function to electrically connect semiconductor device 100 or semiconductor package to an external device (not shown).

Figure 3G:
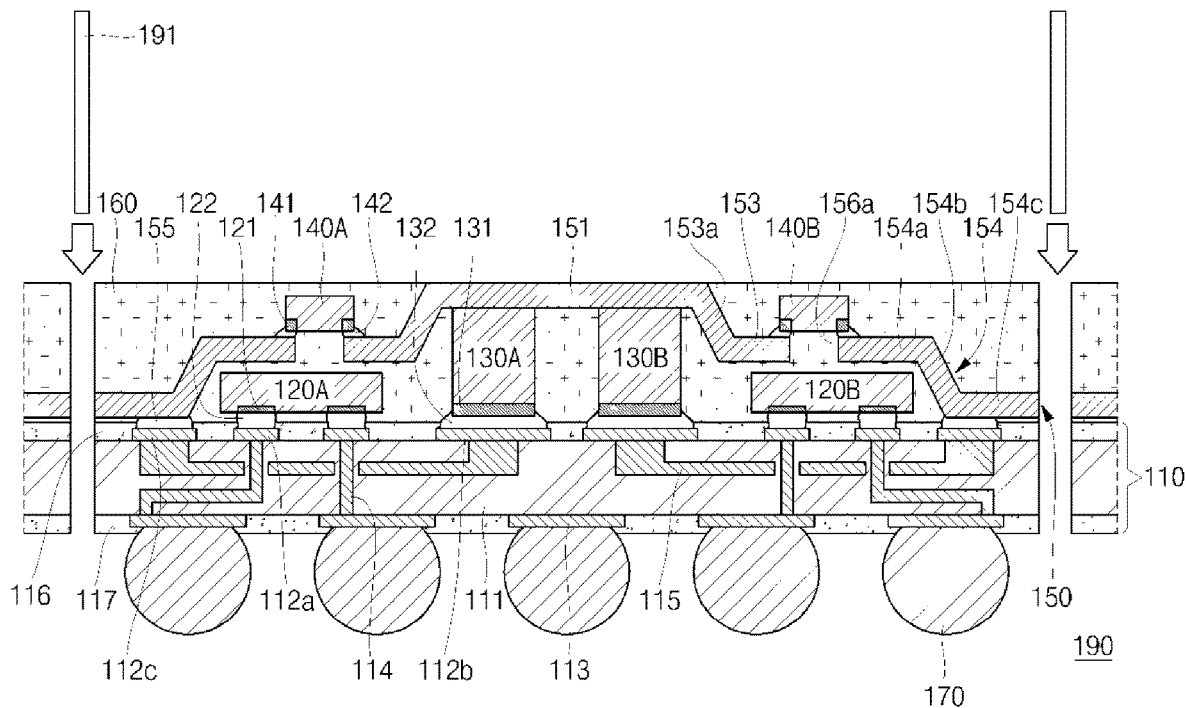

FIG. 3G shows a sawing or singulation process at a later stage of manufacture. Basically, in order to improve productivity of semiconductor device 100, multiple semiconductor devices 100 and/or semiconductor packages can be manufactured concurrently on substrate 110. Accordingly, the sawing or singulation process can be performed at a later stage of manufacture, thereby completing individual semiconductor devices 100 and/or individual semiconductor packages. In some examples, encapsulant 160, lead frame 150 and substrate 110 can be subjected to sawing or singulation in that order or in a reverse order using a diamond blade 191 or laser beam, thereby completing individual semiconductor devices 100. In some examples, after the sawing or singulation, side surfaces of substrate 110, lead frame 150 and/or encapsulant 160 can be made to be coplanar due to processing characteristics. In some examples, side surfaces of leads 154 of lead frame 150 can be made to be coplanar with side surfaces of encapsulant 160 and substrate 110.

Figure 4A:
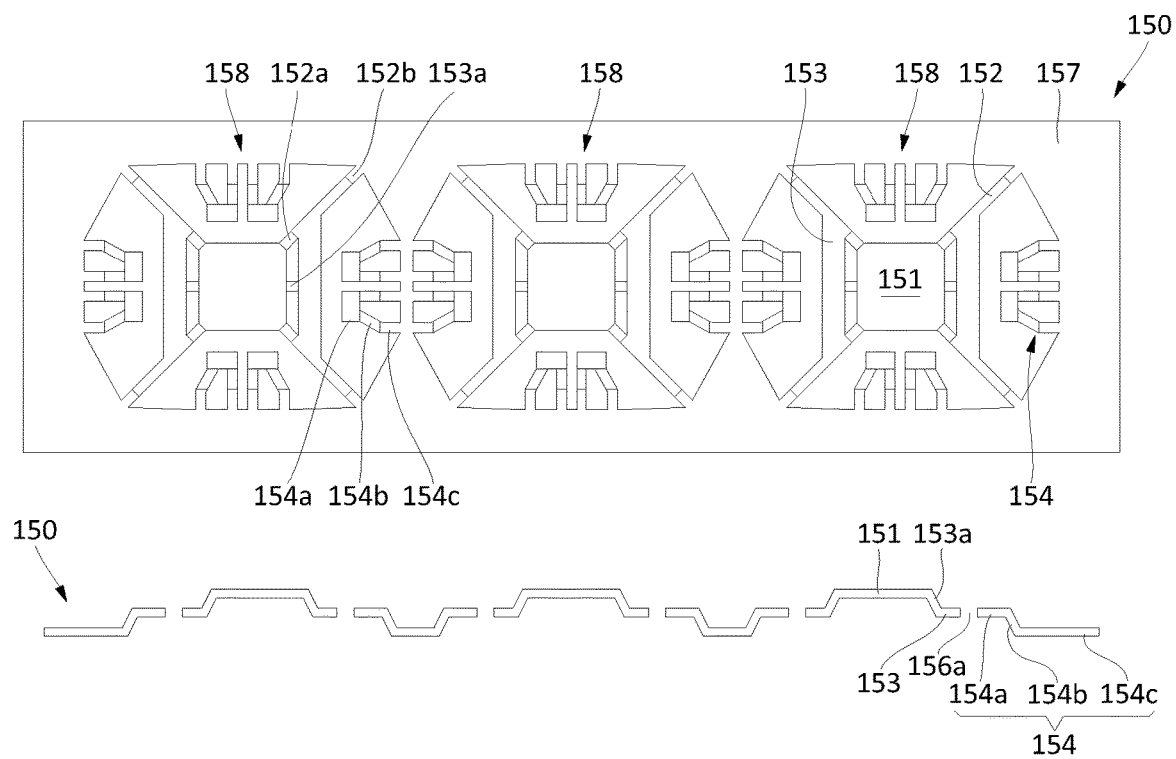
FIGS. 4A to 4C show plan views and cross-sectional views of an example method for mounting components on an example lead frame.
Figure 4B:
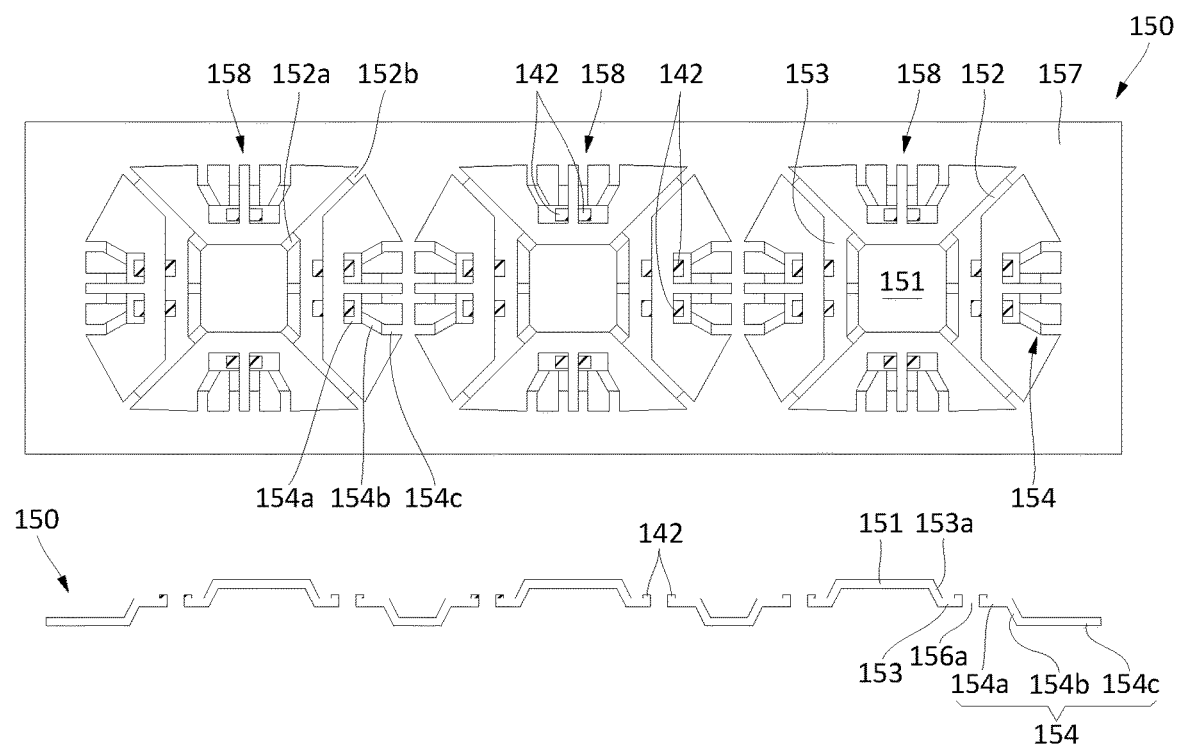
Figure 4C:
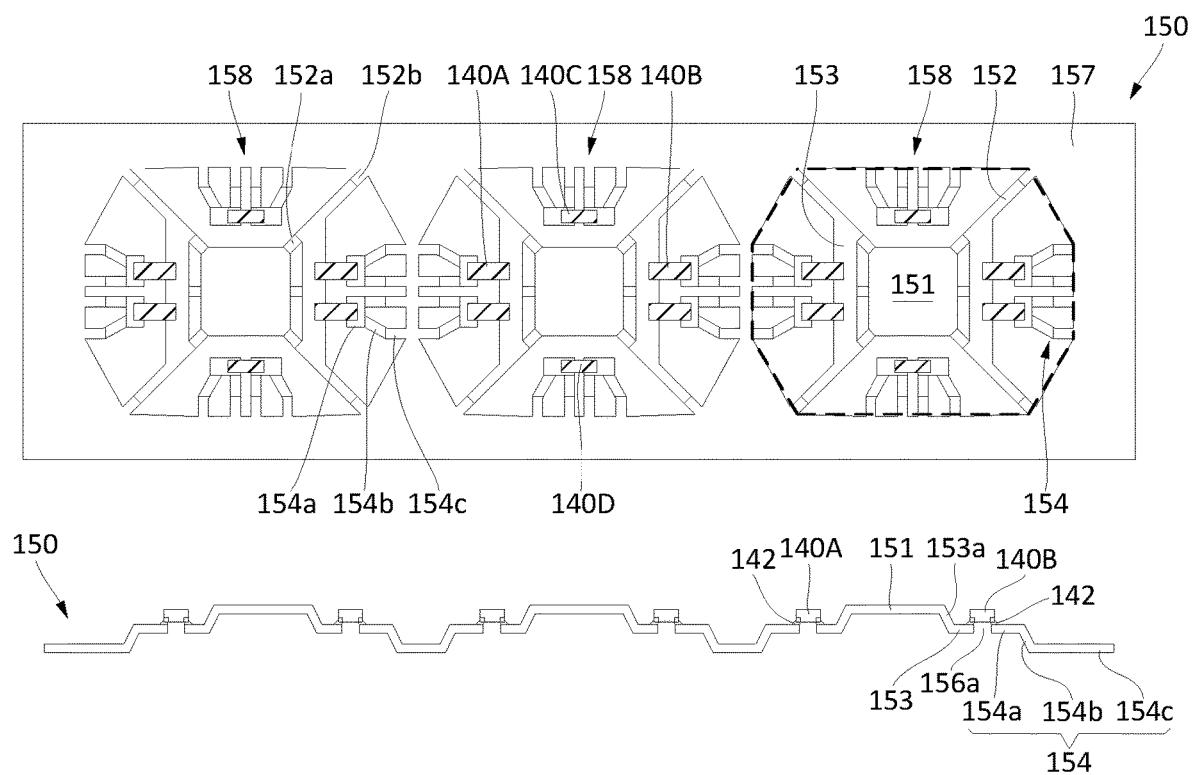

FIG. 4A to FIG. 4C show plan views and cross-sectional views of an example method for mounting components 140A, 140B, 140C, and 140D on an example lead frame 150. FIG. 4A shows a plan view and a cross-sectional view of example lead frame 150.

In the example shown in FIG. 4A, lead frame 150 can have a substantially rectangular shape and can include, for example, three units 158. Here, a single unit 158 can be incorporated into a discrete semiconductor device 100 at a later stage. In some examples, units 158 can be arranged in a line or in a matrix. In some examples, each unit 158 can include a paddle 151, a tie bar 152 having one end connected to paddle 151 and the other end connected to frame 157, a connection bar 153 connected between tie bars 152, and a lead 154 connected to frame 157 to then extend toward paddle 151 or connection bar 153. In some examples, tie bar 152 can include downsets 152a and 152b formed at its opposite ends. In some examples, connection bar 153 can be connected to paddle 151 through downset 153a. In some examples, lead 154 can include mounting region 154a extending toward connection bar 153, connection region 154c connected to frame 157, and downset 154b formed between mounting region 154a and connection region 154c. In this way, while semiconductor device 100 is manufactured, paddle 151 and connection bar 153 can be supported by connecting tie bar 152 to frame 157 and connecting one end of lead 154 to frame 157.

FIG. 4B shows a plan view showing a state in which interconnects 142 are formed on lead frame 150. In the example shown in FIG. 4B, interconnects 142 can be formed in advance on regions of lead frame 150, where components 140A, 140B, 140C, and 140D are to be mounted. In some examples, interconnects 142 can be formed on mounting regions 154a of neighboring leads 154. In some examples, interconnects 142 can be formed on mounting regions 154a of neighboring leads 154 and a region of connection bar 153. In some examples, interconnects 142, such as solder paste, can be formed in advance on mounting regions 154a of neighboring leads 154 and and/or connection bar 153 using a general dispenser.

FIG. 4C shows a plan view showing a state in which components 140A, 140B, 140C, and 140D are mounted on lead frame 150. In the example shown in FIG. 4C, components 140A, 140B, 140C, and 140D can be mounted on regions of lead frame 150, where interconnects 142 are formed. In some examples, components 140A and 140B can be mounted on interconnects 142 formed on mounting regions 154a of neighboring leads 154 and regions of connection bars 153. In some examples, components 140C and 140D can be mounted on interconnects 142 formed on mounting regions 154a of neighboring leads 154. In some examples, components 140A, 140B, 140C, and 140D can be electrically connected to lead frame 150 using a reflow process, a thermal compression process, and/or a laser assist bonding process.

Through the aforementioned process, as shown in FIG. 3D, the lead frame 150 having components 140A, 140B, 140C, and 140D mounted thereon, can be electrically, mechanically, and/or thermally connected to upper wiring pattern 112c of substrate 110 through interconnects 155. In some examples, connection region 154c of lead frame 150 can be connected to upper wiring pattern 112c of substrate 110.

In addition, in the sawing process shown in FIG. 3E, encapsulant 160, substrate 110, and lead frame 150 can be sawed using a diamond blade or laser beam. In some examples, lead frame 150 can be sawed along the dotted line shown in FIG. 4C. Therefore, as the result of the sawing process, paddle 151 and lead 154 can be electrically disconnected from each other.

Figure 5A:
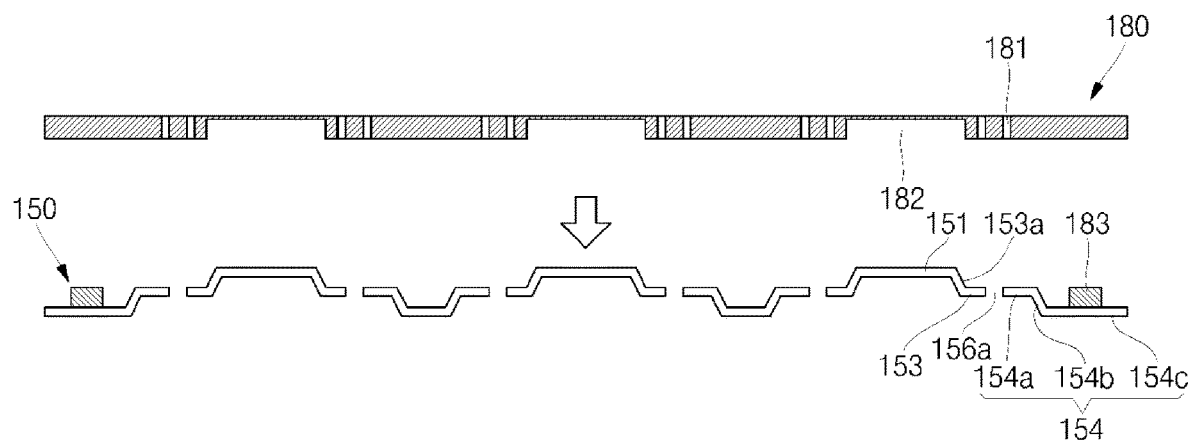
FIGS. 5A and 5B show cross-sectional views of an example method for mounting components on an example lead frame.
Figure 5B:
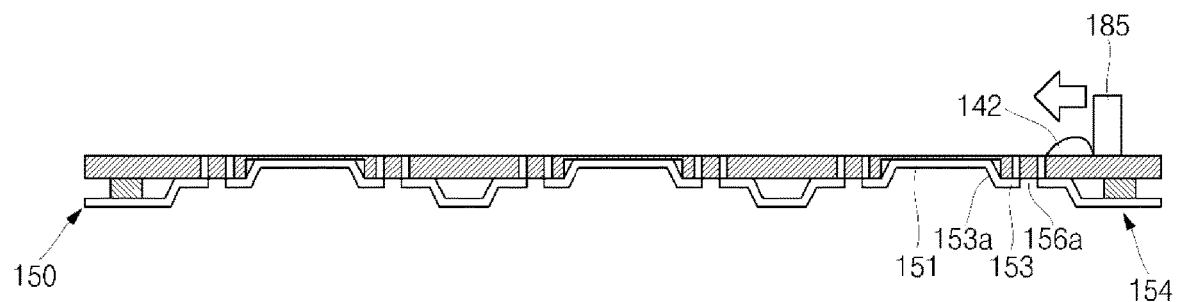

FIG. 5A and FIG. 5B show cross-sectional views of an example method for mounting components 140A, 140B, 140C, and 140D on an example lead frame 150. FIG. 5A shows a cross-sectional view of an example stencil 180 and a lead frame 150.

In the example shown in FIG. 5A, stencil 180 can include a plurality of through-holes 181 for forming interconnects 142, such as solder paste, on lead frame 150. Through-holes 181 can be formed on regions corresponding to mounting regions of components 140A, 140B, 140C, and 140D, as described above. In some examples, stencil 180 can include receiving grooves 182 formed to receive paddle 151 of lead frame 150. In some examples, lead frame 150 can include a temporary support 183 for supporting stencil 180.

FIG. 5B shows a process for forming interconnects on an example lead frame 150. In the example shown in FIG. 5B, after a solder paste 142 is positioned on stencil 180, blade 185 moves in one direction to allow solder paste 142 to be mounted on a predetermined region of lead frame 150 by through-holes 181 of stencil 180. Thereafter, after stencil 180 is removed and components 140A, 140B, 140C, and 140D are then positioned, as described above, components 140A, 140B, 140C, and 140D can be mounted on lead frame 150 using a reflow process, a thermal compression process, and/or a laser assist bonding process.

Figure 6:
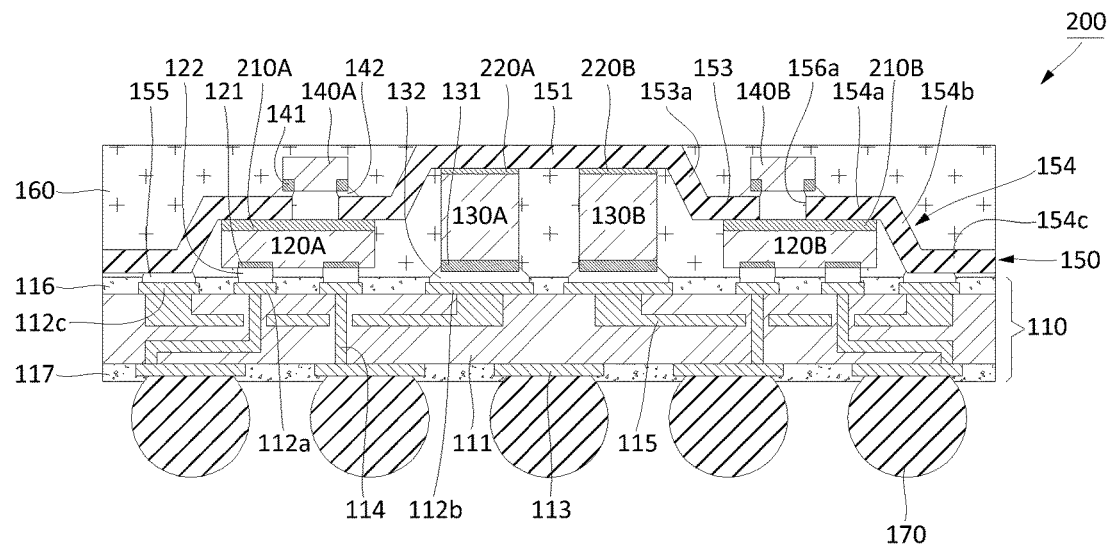
FIG. 6 shows a cross-sectional view of an example semiconductor device.

FIG. 6 shows a cross-sectional view of an example semiconductor device 200. In the example shown in FIG. 6, top surfaces of electronic devices 120A and 120B and/or top surfaces of components 130A and 130B can be brought into contact with or adhered to lead frame 150.

In some examples, top surfaces of electronic devices 120A and 120B can be coupled with or adhered to bottom surfaces of leads 154 and connection bars 153 using interfacing members or covering members 210A and 210B. In some examples, top surfaces of top surfaces of components 130A and 130B can be coupled with or adhered to bottom surfaces of paddle 151 using covering members 220A and 220B. Interface members 210A, 210B, 220A, and 220B can be, for example, thermal interface material (TIM) and/or can include inorganic heat dissipating coating composites having a high thermal conductive filler (e.g., aluminum nitride (AlN), boron nitride (BN), silicon carbide (SiC), etc.) fused with a binder (e.g., a polymer resin). In the same or other some examples, covering members 210A, 210B, 220A, and 220B can be thermal conductive coat materials including a heat-resistant binder prepared by a sol-gel process, a thermally conductive material, and additives, and can have a high thermal conductivity of approximately 100 watts per meter-kelvin (W/m-K) to 400 W/m-K. In some examples, covering members 210A, 210B, 220A, and 220B can be formed on top surfaces of electronic devices 120A and 120B and/or components 130A and 130B using any of a variety of processes (e.g., spraying, dipping, or silk screen coating). In some examples, covering members 210A, 210B, 220A, and 220B can have a coating thickness in the range from approximately 20 μm to approximately 40 μm. In this way, lead frame 150 can efficiently emit heat generated from semiconductor device 200, and electronic devices 120A and 120B and/or components 130A and 130B can be brought into contact with or adhered to lead frame 150 using covering members 210A, 210B, 220A, and 220B to enhance heat dissipation performance of semiconductor device 200.

Figure 7:
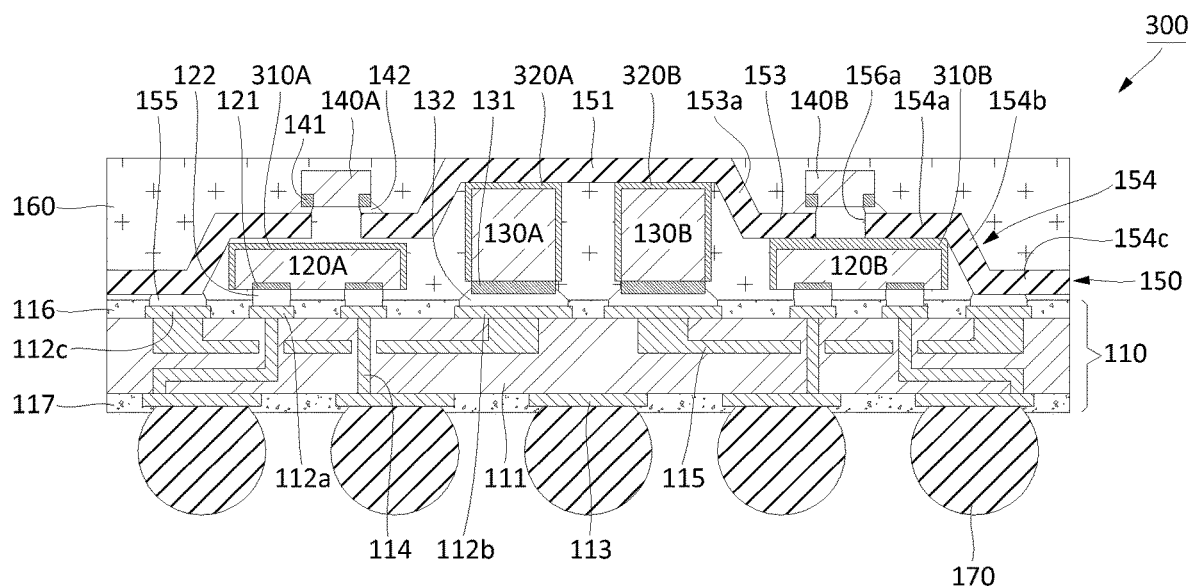
FIG. 7 shows a cross-sectional view of an example semiconductor device.

FIG. 7 shows a cross-sectional view of an example semiconductor device 300. In the example shown in FIG. 7, top surfaces and opposite side surfaces of electronic devices 120A and 120B, and/or top surfaces and opposite side surfaces of components 130A and 1306 can be covered by covering members 310A, 3106, 320A, and 320B. Top surfaces of electronic devices 120A and 120B and/or top surfaces of components 130A and 130B can be coupled with lead frame 150 through covering members 310A, 310B, 320A, 320B.

In some cases, whether top surfaces of electronic devices 120A and 120B and/or top surfaces of components 130A and 1306 are spaced apart from lead frame 150, or whether top surfaces of electronic devices 120A and 120B and/or top surfaces of components 130A and 1306 are coupled with lead frame 150, top surfaces and opposite side surfaces of electronic devices 120A and 1206, and/or top surfaces and opposite side surfaces of components 130A and 130B, can be coated with covering members 310A, 310B, 320A, 320B which are thermally and/or electrically conductive materials, so long as there is no risk of an electrical short of lead frame 150. In some examples, covering members 310A, 310B, 320A, and 320B can include inorganic heat dissipating coating composites having a high thermal conductive filler (e.g., carbon fiber, graphite, carbon nanotube, graphene, etc.) fused with a binder (e.g., a polymer resin). Here, the aforementioned high thermal conductive filler, such as carbon fiber, graphite, carbon nanotube, or graphene, can have a very high thermal conductivity in an axis or surface direction while having a relatively low thermal conductivity in orthogonal directions. Therefore, the high thermal conductive filler can be prepared as a composite material by controlling orientations of such heat dissipating fillers.

In some examples, covering members 310A, 310B, 320A, and 320B can have a thermal conductivity of approximately 100 W/m-K to 400 W/m-k and/or electrical conductivity in the range from approximately 3.0 siemens per centimeter (S/cm) to approximately 5.0 S/cm, and thus they can perform a heat dissipating function and/or an electro-magnetic interference (EMI) shielding function. In some examples, lead frame 150 can perform not only a heat dissipating function but an EMI shielding function. As described above, covering members 310A, 310B, 320A, and 320B, which are thermally and electrically conductive materials, can additionally surround electronic devices 120A and 120B and/or components 130A and 130B, to enhance heat dissipating performance and/or EMI shielding performance of semiconductor device 300.

The present disclosure includes reference to certain examples. It will be understood, however, by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

The invention claimed is:

1. A semiconductor device, comprising:
   a substrate and an electronic device on a top side of the substrate;
   a lead frame on the top side of the substrate over the electronic device, wherein the lead frame comprises a connection bar and a lead;
   a component mounted to the connection bar and the lead on a top side of the lead frame; and
   an encapsulant on the top side of the substrate, wherein the encapsulant contacts a side of the electronic device and a side of the component;
   wherein the component comprises a first terminal coupled with a top side of the connection bar and a second terminal coupled with a top side of the lead; and
   wherein the connection bar and the lead have a gap therebetween, and the component on the top side of the lead frame is mounted to span over the gap.

2. The semiconductor device of claim 1, wherein the lead frame comprises a paddle, and a downset from the paddle to the connection bar, wherein the component is mounted to the connection bar and the lead at a level lower than a top side of the paddle.

3. The semiconductor device of claim 2, further comprising an additional component on the top side of the substrate under the paddle.

4. The semiconductor device of claim 3, wherein the additional component is thermally coupled with the paddle.

5. The semiconductor device of claim 1, wherein the electronic device is below the component.

6. The semiconductor device of claim 1, wherein a top side of the encapsulant is coplanar with a top side of the lead frame.

7. The semiconductor device of claim 1, wherein the substrate comprises a pre-formed substrate.

8. The semiconductor device of claim 1, wherein the substrate comprises a redistribution layer (RDL) substrate.

9. The semiconductor device of claim 1, wherein the lead comprises a connection region electrically coupled with a conductive path of the substrate.

10. The semiconductor device of claim 1, wherein the first terminal and the second terminal are on a bottom side of the component.

11. A semiconductor structure, comprising:
   a substrate having a top side and a conductive path;
   a lead frame comprising a heatsink, a connection bar, a downset between the heatsink and the connection bar, and a lead electrically coupled with the conductive path, wherein the connection bar is lower than the heatsink;
   a first component on the top side of the substrate and coupled to the heatsink;
   a second component on a top side of the lead frame between the connection bar and the lead; and
   an encapsulant on the top side of the substrate contacting a side of the second component;
   wherein the lead comprises a mounting region, a connection region, and an additional downset between the mounting region and the connection region;

wherein the lead is electrically coupled to the conductive path at the connection region; and an electronic device on the top side of the substrate under the mounting region below the second component.

12. The semiconductor structure of claim 11, further comprising an interface component between a top side of the first component and a bottom side of the heatsink.

13. The semiconductor structure of claim 12, wherein the interface component comprises a thermal interface material (TIM).

14. The semiconductor structure of claim 11, wherein the electronic device is thermally coupled to the lead frame.

15. A method to manufacture a semiconductor device, comprising:

providing a substrate having a top side;

providing an electronic device on the top side of the substrate;

mounting a component on a top side of a lead frame, wherein the component is mounted between a connection bar and a lead of the lead frame;

connecting the lead frame to the top side of the substrate; and providing an encapsulant on the top side of the substrate contacting a side of the electronic device and a side of the component;

wherein the connection bar and the lead have a gap therebetween, and the component is mounted on the top side of the lead frame to span over the gap; and wherein mounting the component comprises providing interconnects on the connection bar and the lead, and electrically connecting the component to the lead frame at the interconnects.

16. The method of claim 15, further comprising providing an additional component of the top side of the substrate.

17. The method of claim 16, wherein the additional component is under a paddle of the lead frame.

18. The method of claim 16, further comprising thermally coupling the additional component to the lead frame.

* * * * *